United States Patent
Jain et al.

(10) Patent No.: US 10,134,880 B2
(45) Date of Patent: Nov. 20, 2018

(54) SELF-ALIGNED BIPOLAR JUNCTION TRANSISTORS WITH A BASE GROWN IN A DIELECTRIC CAVITY

(71) Applicant: GLOBALFOUNDRIES Inc., Grand Cayman (KY)

(72) Inventors: Vibhor Jain, Essex Junction, VT (US); Qizhi Liu, Lexington, MA (US); Alvin J. Joseph, Williston, VT (US); Pernell Dongmo, Essex Junction, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/473,043

(22) Filed: Mar. 29, 2017

(65) Prior Publication Data
US 2018/0286968 A1    Oct. 4, 2018

(51) Int. Cl.
| | |
|---|---|
| *H01L 21/331* | (2006.01) |
| *H01L 29/732* | (2006.01) |
| *H01L 29/06* | (2006.01) |
| *H01L 29/08* | (2006.01) |
| *H01L 29/10* | (2006.01) |
| *H01L 29/66* | (2006.01) |
| *H01L 21/311* | (2006.01) |
| *H01L 21/02* | (2006.01) |
| *H01L 29/737* | (2006.01) |
| *H01L 29/165* | (2006.01) |

(52) U.S. Cl.
CPC ...... *H01L 29/732* (2013.01); *H01L 21/02532* (2013.01); *H01L 21/02636* (2013.01); *H01L 21/31111* (2013.01); *H01L 29/0649* (2013.01); *H01L 29/0804* (2013.01); *H01L 29/0821* (2013.01); *H01L 29/1004* (2013.01); *H01L 29/165* (2013.01); *H01L 29/66234* (2013.01); *H01L 29/66242* (2013.01); *H01L 29/7371* (2013.01)

(58) Field of Classification Search
CPC ................. H01L 29/0826; H01L 29/66287
USPC ................. 438/318, 320, 343, 360, 366
See application file for complete search history.

(56) References Cited

U.S. PATENT DOCUMENTS

| | | | |
|---|---|---|---|
| 6,706,583 B1* | 3/2004 | Comard | H01L 29/66242 257/E21.371 |
| 6,927,476 B2 | 8/2005 | Freeman et al. | |
| 7,598,539 B2 | 10/2009 | Wilhelm | |
| 7,615,457 B2 | 11/2009 | Akatsu et al. | |
| 8,003,473 B2* | 8/2011 | Pagette | H01L 29/0821 257/E29.034 |

(Continued)

OTHER PUBLICATIONS

Wang, et al., The Behavior of Narrow-Width SOI MOSFET's with MESA Isolation:, IEEE Transactions on Electron Devices vol. 47, No. 3, Mar. 2000.

*Primary Examiner* — Chandra Chaudhari
(74) *Attorney, Agent, or Firm* — Thompson Hine LLP; Anthony Canale (57) ABSTRACT

Fabrication methods and device structures for bipolar junction transistors and heterojunction bipolar transistors. A first dielectric layer is formed and a second dielectric layer is formed on the first dielectric layer. An opening is etched extending vertically through the first dielectric layer and the second dielectric layer. A collector is formed inside the opening. An intrinsic base, which is also formed inside the opening, has a vertical arrangement relative to the collector.

20 Claims, 6 Drawing Sheets

(56) References Cited

U.S. PATENT DOCUMENTS

| | | |
|---|---|---|
| 8,610,174 B2 | 12/2013 | Adkisson et al. |
| 8,933,537 B2 | 1/2015 | Fox et al. |
| 9,093,491 B2 | 7/2015 | Adkisson et al. |
| 9,245,951 B1 | 1/2016 | Camillo-Castillo et al. |

* cited by examiner

SELF-ALIGNED BIPOLAR JUNCTION TRANSISTORS WITH A BASE GROWN IN A DIELECTRIC CAVITY

BACKGROUND

The invention relates generally to semiconductor device and integrated circuit fabrication and, in particular, to fabrication methods and device structures for bipolar junction transistors and heterojunction bipolar transistors.

A bipolar junction transistor is a three-terminal electronic device that includes an emitter, an intrinsic base, and a collector in its construction. The intrinsic base is arranged between the emitter and collector in the structure of the device. In an NPN bipolar junction transistor, the emitter and collector may be composed of n-type semiconductor material, and the intrinsic base may be composed of p-type semiconductor material. In a PNP bipolar junction transistor, the emitter and collector may be composed of p-type semiconductor material, and the intrinsic base may be composed of n-type semiconductor material. In operation, the base-emitter junction is forward biased, the base-collector junction is reverse biased, and the collector-emitter current may be controlled with the base-emitter voltage.

A heterojunction bipolar transistor is a variant of a bipolar junction transistor in which at least two of the collector, emitter, and intrinsic base are constituted by semiconductor materials with different energy bandgaps, which creates heterojunctions. For example, the collector and/or emitter of a heterojunction bipolar transistor may be constituted by silicon, and the base of a heterojunction bipolar transistor may be constituted by a silicon germanium (SiGe) alloy, which is characterized by a narrower band gap than silicon.

Improved fabrication methods and device structures for bipolar junction transistors and heterojunction bipolar transistors are needed.

SUMMARY

In an embodiment of the invention, a structure for a bipolar junction transistor includes a first dielectric layer, a second dielectric layer on the first dielectric layer, and an opening extending vertically through the first dielectric layer and the second dielectric layer. A collector is positioned inside the opening, and an intrinsic base is positioned inside the opening. The intrinsic base has a vertical arrangement relative to the collector.

In an embodiment of the invention, a method of fabricating a bipolar junction transistor includes forming a first dielectric layer, forming a second dielectric layer on the first dielectric layer, and etching an opening extending vertically through the first dielectric layer and the second dielectric layer. The method further includes forming a collector inside the opening, and forming an intrinsic base inside the opening. The intrinsic base has a vertical arrangement relative to the collector.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
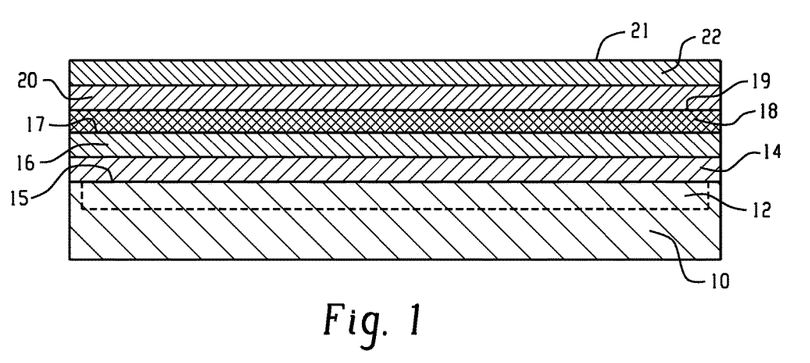
FIG. 1 is a cross-sectional view of a device structure at an initial fabrication stage of a processing method in accordance with embodiments of the invention.

With reference to FIG. 1 and in accordance with an embodiment of the invention, a substrate 10 comprises a single-crystal semiconductor material usable to form the devices of an integrated circuit. For example, the substrate 10 may be comprised of a bulk wafer of a monocrystalline silicon-containing material, such as single-crystal silicon, or a device layer of a silicon-on-insulator wafer. A subcollector 12 may be formed beneath the top surface of the substrate 10 by introducing an electrically-active dopant, such as an impurity species from Group V of the Periodic Table (e.g., phosphorus (P), arsenic (As), or antimony (Sb)) effective to impart an n-type conductivity. In one embodiment, the subcollector 12 may be formed by a masked high-current ion implantation followed by a high-temperature thermal anneal.

Dielectric layers 14, 16, 18, 20, 22 are serially formed as a layer stack on the substrate 10. Dielectric layer 14 constitutes the bottommost layer in the layer stack, dielectric layer 18 constitutes the central layer in the layer stack, and dielectric layer 22 constitutes the topmost layer in the layer stack. The dielectric layer 16 is arranged in the vertical direction between dielectric layer 14 and dielectric layer 18. The dielectric layer 20 is arranged in the vertical direction between dielectric layer 22 and dielectric layer 18. A top surface 21 of dielectric layer 22 defines the top surface of the layer stack, and a bottom surface 15 of dielectric layer 14 defines a bottom surface of the layer stack. The bottom surface 15 of the dielectric layer 14 may be in direct contact with substrate 10. The dielectric layer 16 includes a top surface 17 that be in direct contact with the dielectric layer 18 along an interface, and the dielectric layer 20 includes a bottom surface 19 that may be in direct contact with the dielectric layer 18 along an interface.

Dielectric layer 14 and dielectric layer 22 may be comprised of an electrical insulator or dielectric material having a given density. In an embodiment, the dielectric layers 14, 22 may be comprised of silicon dioxide ($SiO_2$) deposited by low pressure chemical vapor phase deposition (LPCVD) at a temperature in a range of 800° C. to 900° C. using a gas mixture that includes dichlorosilane ($SiCl_2H_2$, DCS) as a silicon-containing component and nitrous oxide ($N_2O$) as an oxygen-containing component. Such oxides of silicon are known as a high temperature oxide (HTO).

Dielectric layer 16 and dielectric layer 20 may be comprised of an electrical insulator or dielectric material having a given density that is greater than the given density of dielectric layer 14 and dielectric layer 22. In an embodiment, the dielectric layers 14, 22 may be comprised of silicon dioxide (SiO$_2$) deposited by a high-density plasma chemical vapor deposition (HDPCVD) process using inductively-coupled plasma without radiofrequency substrate biasing and without substrate clamping (unbiased, unclamped or UBUC). HDPCVD processes may utilize a gas mixture including a silicon-containing component, such as silane (SiH$_4$), an oxygen-containing component, such as oxygen gas (O$_2$), and an inert gas, such as argon (Ar), to simultaneously deposit and etch dielectric material, where SiH$_4$ and O$_2$ combine at the substrate to form SiO$_2$ for the deposition component, and O$_2$ and Ar ions provide a sputter etch component. In a UBUC variation on a HDPCVD process, the sputter etch component is absent due to the absence of substrate biasing and clamping.

Dielectric layer 18 may be comprised of an electrical insulator or dielectric material with an etch selectivity to the dielectric layers 14, 16 and the dielectric layers 20, 22. In one embodiment in which the dielectric layers 14, 16 and dielectric layers 20, 22 are comprised of silicon dioxide of different densities, the dielectric layer 18 may be comprised of silicon nitride (Si$_3$N$_4$) deposited by CVD. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal process.

Figure 2:
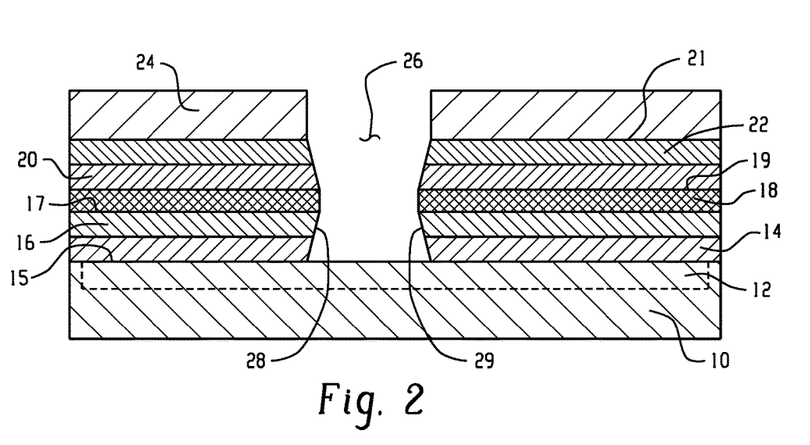
FIG. 2 is a cross-sectional view of the device structure at a fabrication stage of the processing method subsequent to FIG. 1.

With reference to FIG. 2 in which like reference numerals refer to like features in FIG. 1 and at a subsequent fabrication stage of the processing method, an etch mask 24 is applied on dielectric layer 22 and patterned. The etch mask 24 may be comprised of a layer of a light-sensitive material, such as an organic photoresist, applied by a spin coating process, pre-baked, exposed to light projected through a photomask, baked after exposure, and developed with a chemical developer. The etch mask 24 includes an opening that is aligned with an intended location for an opening 26 that extends vertically through the dielectric layers 14, 16, 18, 20, 22 to the top surface of the substrate 10. The opening 26 may be formed in the dielectric layers 14, 16, 18, 20, 22 by one or more etching processes in which each etching process, which may be a reactive ion etching (RIE) process or a wet chemical process, is performed with a single etching step having an etch chemistry or multiple etching steps with different etch chemistries. After the opening 26 is extended through one or more of the dielectric layers 14, 16, 18, 20, 22, the etch mask 24 may be stripped by, for example, ashing.

The opening 26 may have sidewalls 28, 29 that extend or penetrate vertically through the respective thicknesses of dielectric layers 14, 16, 18, 20, 22 from a top surface 21 of dielectric layer 22 to the bottom surface 15 of dielectric layer 14. The portion of the sidewalls extending vertically through the dielectric layers 14, 16 is inclined relative to the vertical direction, the portion of the sidewalls extending vertically through the dielectric layers 22, 20 is also inclined relative to the vertical direction, and the portion of the sidewalls extending vertically through the dielectric layer 18 is parallel to the vertical direction.

The sidewalls 28, 29 of the opening 26 over the portion of the opening 26 that extends through the dielectric layers 14, 16 from the top surface 17 of dielectric layer 16 to the bottom surface 15 of dielectric layer 14 tapers with increasing distance from the top surface 17 in a vertical direction toward the bottom surface 15. The distance between the sidewalls 28, 29 (i.e., the width of the opening 26) decreases with increasing separation from the bottom surface 15 of dielectric layer 14 with the largest width occurring at the bottom surface 15 of dielectric layer 14 and the smallest width occurring at the top surface 17 such that the tapering of the sidewalls 28, 29 converges toward the bottom surface 15.

The sidewalls 28, 29 of the opening 26 over the portion of the opening 26 that extends through the dielectric layers 20, 22 from the top surface 21 of dielectric layer 22 to the bottom surface 19 of dielectric layer 18 tapers with increasing distance from the top surface 21 in a vertical direction toward the bottom surface 19. The distance between the sidewalls 28, 29 (i.e., the width of the opening 26) decreases with increasing separation from the top surface 21 of dielectric layer 22 of dielectric layer 18 with the largest width occurring at the top surface 21 and the smallest width occurring at the bottom surface 19 such that the tapering of the sidewalls 28, 29 converges toward the bottom surface 19. The tapering of the sidewalls 28, 29 of the opening 26 over the portion of the opening 26 that extends through the dielectric layers 20, 22 is inverted relative to the tapering of sidewalls 28, 29 of the opening 26 over the portion of the opening 26 that extends through the dielectric layers 14, 16.

Due at least in part to the density difference, the dielectric layer 14 may have a different etch rate than the dielectric layer 16, and the dielectric layer 22 may have a different etch rate than the dielectric layer 20. An etching process may be selected that has an etch chemistry that etches the dielectric layers 14 and 22 at an etch rate that is greater than an etch rate for the dielectric layers 16 and 20. For example, the etching process may be a wet chemical etch that uses buffered hydrofluoric acid (BHF) as an etchant, or may be a combination of a reactive ion etch (ME) followed by a wet chemical etch. The etch chemistry of the etching process may remove the dielectric materials of the dielectric layers 14, 16, 20, and 22 selective to the dielectric material of dielectric layer 18.

The portion of the opening 26 extending through the dielectric layer 18 may rely on a given etch chemistry that removes the dielectric material of the dielectric layer 18 selective to the dielectric materials constituting the dielectric layers 16, 20, and 22. For example, a wet chemical etch using hot phosphoric acid as an etching chemistry may remove silicon nitride of dielectric layer 18 selective to silicon dioxide constituting the dielectric layers 16, 20, and 22.

In a representative embodiment, the tapering of the sidewalls 28, 29 of the opening 26 over the portion of the opening 26 that extends through the dielectric layers 20, 22 is linear, and the tapering of sidewalls 28, 29 of the opening 26 over the portion of the opening 26 that extends through the dielectric layers 14, 16 is linear such that the sidewalls 28, 29 are flat or planar over each of these sections of the opening 26. However, the sidewalls 28, 29 may have a different shape over each of these sections of the opening 26.

Figure 2A:
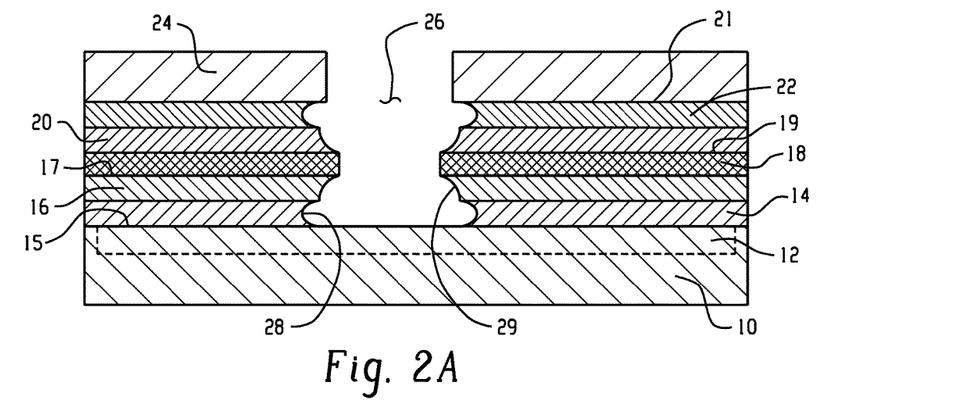
FIG. 2A is a cross-sectional view similar to FIG. 2 of a device structure in accordance with embodiments of the invention.

For example and as shown in FIG. 2A, the sidewalls 28, 29 over the portion of the opening 26 that extends through each of the dielectric layers 14, 16 and over the portion of the opening 26 that extends through each of the dielectric layers 20, 22 may be curved with a bowl-shape instead of being flat as in FIG. 2. In particular, the sidewalls 28, 29 over the portion of the opening 26 that extends through the dielectric layer 14 may have a concave curvature and the sidewalls 28, 29 over the portion of the opening 26 that extends through the dielectric layer 16 may have a concave curvature with a lesser degree of lateral recessing. The sidewalls 28, 29 over the portion of the opening 26 that extends through the dielectric layer 22 may have a concave curvature and the sidewalls 28, 29 over the portion of the opening 26 that extends through the dielectric layer 20 may have a concave curvature with a lesser degree of lateral recessing.

Figure 3:
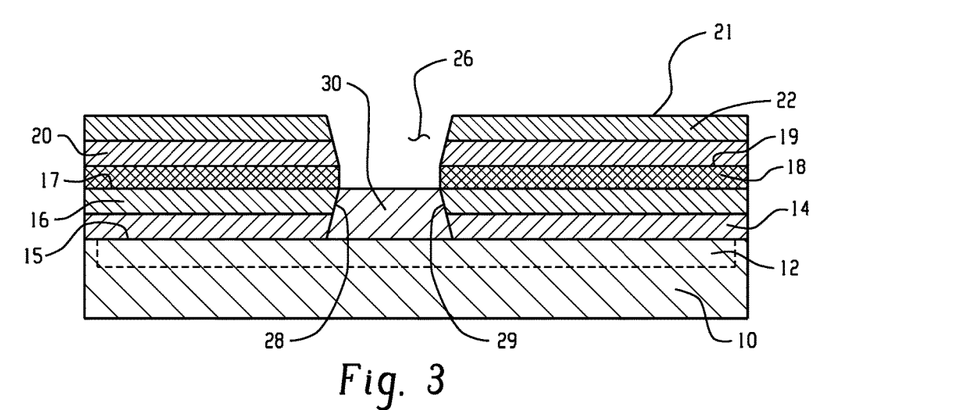
FIGS. 3-7 are cross-sectional views of the device structure at successive fabrication stages of the processing method subsequent to FIG. 2.

With reference to FIG. 3 in which like reference numerals refer to like features in FIG. 2 and at a subsequent fabrication stage of the processing method, a collector 30 is formed as a semiconductor layer on the surface of the substrate 10 in the open space inside the opening 26 above the top surface of the substrate 10 and between the sidewalls 28, 29 over the portion of the opening 26 that extends through the dielectric layers 14, 16. The collector 30 is coupled with the subcollector 12 in the substrate 10. The shape of the semiconductor layer forming the collector 30 conforms at its sidewalls to the shape of the sidewalls 28, 29 over the portion of the opening 26 that extends through the dielectric layers 14, 16.

The collector 30 may be comprised of single-crystal semiconductor material, such as single-crystal silicon, grown by an epitaxial growth process. In an embodiment, the collector 30 may be formed by a selective epitaxial growth (SEG) process in which semiconductor material nucleates for epitaxial growth on semiconductor surfaces such as the single crystal substrate 10, but does not nucleate for epitaxial growth from insulator surfaces, such as the top surface of the dielectric layer 22 and the dielectric layers 18, 20, 22 at the sidewalls 28, 29 of the opening 26. The collector 30 may be either undoped or lightly doped in situ during growth with, for example, an n-type dopant (e.g., phosphorus (P) or arsenic (As)) effective to impart n-type conductivity. The collector 30 may include an optional selectively implanted collector (SIC) region formed by ion implantation. The thickness of the collector 30 is selected such that the collector 30 does not extend above the surface 17 of the dielectric layer 16 so as to occlude the sidewall 28, 29 at the horizontal level of the dielectric layer 18.

Figure 4:
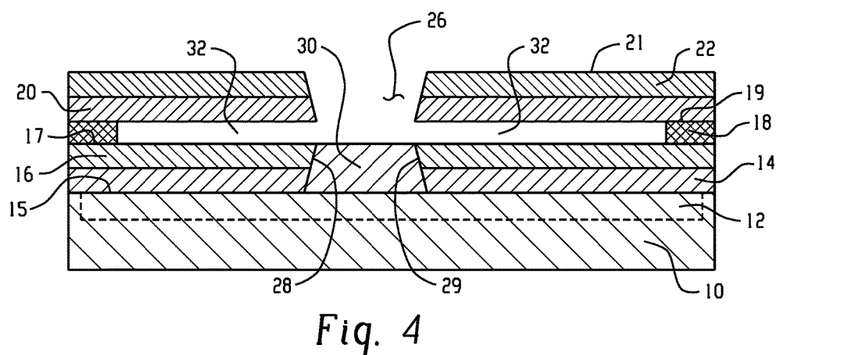

With reference to FIG. 4 in which like reference numerals refer to like features in FIG. 3 and at a subsequent fabrication stage of the processing method, the dielectric layer 18 is laterally recessed relative to the underlying dielectric layer 16 and the overlying dielectric layer 20 with an etching process to form a cavity 32. The cavity 32 is located vertically between the dielectric layer 16 and the dielectric layer 20, and extends in a horizontal direction relative to the opening 26. The cavity 32 may be symmetrical relative to a vertical centerline of the opening 26. If the dielectric layers 20, 22 are comprised of silicon dioxide and the dielectric layer 18 is comprised of silicon nitride, then an etch chemistry for a wet or dry etching process that isotropically etches silicon nitride selective to silicon dioxide may be chosen. For example, a suitable etch chemistry for forming the cavity 32 may be a hot phosphoric acid for a wet chemical etch of silicon nitride selective to silicon dioxide.

The shape of the collector 30 matches the shape of the opening 26 over the portion of the opening 26 that extends through the dielectric layers 14, 16. Similar to this portion of the opening 26, the collector 30 has a tapered width that progressively decreases in a vertical direction with decreasing distance from the intrinsic base 34. In particular, the sidewalls of the collector 30 conform to the shape of the sidewalls 28, 29 of the opening 26. In an embodiment, the sidewalls of the collector 30 will adopt a convex curvature if the sidewalls 28, 29 over the portion of the opening 26 that extends through the dielectric layers 14, 16 have a concave curvature as shown in FIG. 2A.

Figure 5:
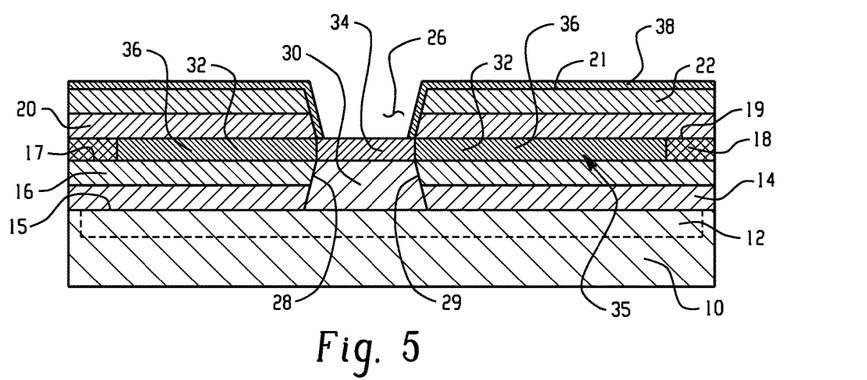

With reference to FIG. 5 in which like reference numerals refer to like features in FIG. 4 and at a subsequent fabrication stage of the processing method, an intrinsic base 34 is formed inside the opening 26 and an extrinsic base 36 is formed in the cavity 32 (FIG. 4) from sections of a base layer 35 that is non-selectively deposited. The extrinsic base 36 adopts the shape of the cavity 32, and extends in a horizontal direction from the intrinsic base 34. The intrinsic base 34 is coupled with the collector 30, and a field section 38 of the base layer 35 forms on the top surface of the dielectric layer 22 and on the sidewalls 28, 29 of the opening 26 above the height of the intrinsic base 34. The thickness of the dielectric layer 18 is selected such that the cavity 32 is filled by semiconductor material before the entrance to the cavity 32 is occluded by the formation of the intrinsic based 34 inside the opening 26.

The intrinsic base 34 of the base layer 35 is comprised of single crystal semiconductor material that is positioned in vertical alignment with the collector 30 inside the opening 26 and that directly contacts the single crystal semiconductor material of the collector 30. The intrinsic base 34 grows epitaxially on the collector 30 with a crystal structure that has a single orientation. The intrinsic base 34 participates in forming a collector-base junction with collector 30 in the device structure. The extrinsic base 36 and the field section 38 of the base layer 35 may be comprised of polycrystalline semiconductor material (e.g., polysilicon) with a crystal structure comprised of grains that lack a uniform crystalline orientation resulting from growth on insulator surfaces.

The base layer 35 may be comprised of a semiconductor material layer deposited using a non-selective deposition process, such as chemical vapor deposition (CVD). The semiconductor material comprising the base layer 35 differs in composition from the semiconductor material comprising the collector 30 and may be doped to have an opposite conductivity type from the collector 30. For example, the base layer 35 may be composed of a semiconductor material, such as silicon (Si) or silicon-germanium (SiGe) in an alloy with a content of silicon (Si) ranging from 95 atomic percent to 50 atomic percent and a peak content of germanium (Ge) ranging from 5 atomic percent to 50 atomic percent. The germanium content of the base layer 35 may be graded and/or stepped across the thickness of base layer 35. The semiconductor material of the base layer 35 may be lightly doped with an electrically-active dopant, such as a p-type dopant (e.g., boron (B)) selected from Group III of the Periodic Table in a concentration that is effective to impart p-type conductivity and, optionally, carbon (C) that is effective to suppress the diffusion of the p-type dopant. The intrinsic base 34 and the extrinsic base 36 of the base layer 35 are formed concurrently by the same deposition process.

Figure 6:
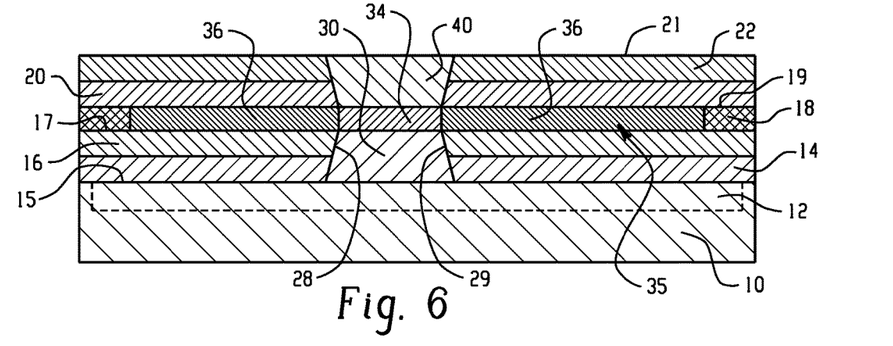

With reference to FIG. 6 in which like reference numerals refer to like features in FIG. 5 and at a subsequent fabrication stage of the processing method, the field section 38 of the base layer 35 may be removed to reveal the top surface 21 of the dielectric layer 22 and the sidewalls 28, 29 of the opening 26 above the intrinsic base 34. The field section 38 may be etched for removal at a higher etch than (i.e., selective to) the material of the intrinsic base 34. For example, a chlorine chemistry (e.g., $Cl_2$ or HCl) may be chosen for etching polycrystalline semiconductor material relative to single crystal semiconductor material.

An emitter 40 is formed as a semiconductor layer on the surface of the intrinsic base 34 in the open space inside the opening 26 above the top surface of the intrinsic base 34 and between the sidewalls 28, 29 over the portion of the opening 26 that extends through the dielectric layers 20, 22. The emitter 40 is coupled with the intrinsic base 34 across an emitter-base junction. The shape of the semiconductor layer forming the emitter 40 conforms at its sidewalls to the shape of the sidewalls 28, 29 over the portion of the opening 26 that extends through the dielectric layers 20, 22. Similar to this portion of the opening 26, the emitter 40 has a tapered width that progressively decreases in a vertical direction with decreasing distance from the intrinsic base 34. In particular, the sidewalls of the emitter 40 conform to the shape of the sidewalls 28, 29 of the opening 26. In an embodiment, the sidewalls of the emitter 40 will adopt a convex shape if the sidewalls 28, 29 over the portion of the opening 26 that extends through the dielectric layers 20, 22 have a concave curvature as shown in FIG. 2A. The wider top surface of the emitter 40 may permit the use of a larger contact and a greater overlay tolerance.

The emitter 40 may be comprised of single-crystal semiconductor material, such as single-crystal silicon, grown by an epitaxial growth process. In an embodiment, the emitter 40 may be formed by a selective epitaxial growth (SEG) process in which semiconductor material nucleates for epitaxial growth on semiconductor surfaces such as the single crystal substrate 10, but does not nucleate for epitaxial growth from insulator surfaces, such as the top surface of the dielectric layer 22. The emitter 40 may be either heavily doped in situ during growth with, for example, an n-type dopant (e.g., phosphorus (P) or arsenic (As)) effective to impart n-type conductivity.

Figure 7:
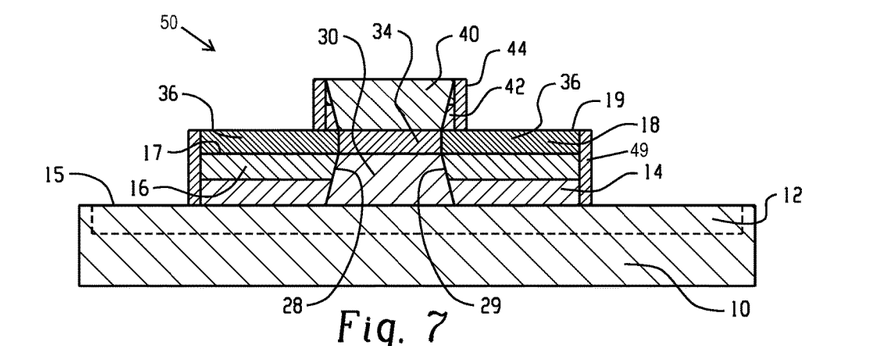

With reference to FIG. 7 in which like reference numerals refer to like features in FIG. 6 and at a subsequent fabrication stage, spacers 42 are formed at the sidewalls of the emitter 40 from the dielectric layers 20, 22. If the dielectric layers 20, 22 are composed of silicon dioxide, a blanket low power oxide etch may be used that removes the constituent materials of the dielectric layers 20, 22 selective to the material of the extrinsic base 36. A contact area on the top surface of the extrinsic base 36 is opened by the removal of the dielectric layers 20, 22. Dielectric spacers 44 may be formed at the sidewalls of the emitter 40 by depositing a conformal layer and etching the material (e.g., silicon nitride ($Si_3N_4$)) of the conformal layer with an etching process, such as reactive ion etching (RIE), that preferentially removes the material from horizontal surfaces, such as the top surface of the extrinsic base 36.

After being revealed by the removal of the dielectric layers 20, 22, the extrinsic base 36 may be implanted with a dopant, such as a p-type dopant (e.g., boron) to increase the electrical conductivity of its constituent semiconductor material. Alternatively, a highly-doped epitaxial semiconductor layer of the same conductivity type as the extrinsic base 36 may be grown by selective epitaxial growth on the extrinsic base 36 to provide a raised extrinsic base. The contact area for the collector 30 is opened by patterning the extrinsic base 36 and the dielectric layers 14, 16 to expose the top surface of the substrate 10 for contacting the subcollector 12 at the top surface. Dielectric spacers 49 may be formed at the side edges of the extrinsic base 36 and underlying dielectric layers 14, 16.

The resulting device structure 50 is a bipolar junction transistor characterized by a vertical architecture that includes the collector 30 as one terminal, the emitter 40 as another terminal, and the intrinsic base 34 located vertically between the collector 30 and emitter 40. The intrinsic base 34 adjoins the collector 30 along a p-n junction. The emitter 40 adjoins the intrinsic base 34 along another p-n junction. The device structure 50 may be characterized as a heterojunction bipolar transistor (HBT) if two or all three of the collector 30, the intrinsic base 34, and the emitter 40 are comprised of different semiconductor materials (e.g., Si for the collector 30 and emitter 40, and SiGe for the intrinsic base 34).

In an alternative embodiment, the role of the emitter 40 and collector 30 as terminals in the device structure 50 may be swapped to provide a collector-up structure instead of the emitter-up structure shown in FIG. 7. The object labeled as the emitter 40 will function as a collector of the collector-up structure, and the object labeled as the collector 30 will function as an emitter of the collector-up structure. In such a collector-up structure, the intrinsic base 34 is arranged in the vertical direction between the collector and emitter, the collector is located above the intrinsic base 34 in a vertical direction, and the emitter is located below the intrinsic base 34 in the vertical direction.

Middle-of-line (MOL) processing and back-end-of-line (BEOL) processing follow, which includes formation of silicide, contacts, and wiring for a MOL local interconnect structure, and formation of dielectric layers, via plugs, and wiring for a BEOL interconnect structure coupled by the local interconnect structure with the device structure 50.

The collector 30, the intrinsic base 34, and the emitter 40 of the device structure 50 are self-aligned because each is successively formed inside the opening 26 that extends in the vertical direction through the dielectric layers 14, 16, 18, 20, 22. As a result, the dimensions of the collector 30, the intrinsic base 34, and the emitter 40 are not limited by photolithography tolerances. The collector 30, the intrinsic base 34, and the emitter 40 are self-aligned due to the manner in which they are formed in the opening 26. The self-alignment of the collector 30, the intrinsic base 34, and the emitter 40 may improve the performance of the device structure 50. The device structure 50 may be used in either power amplifiers or low noise amplifiers in an end application. Because at least in part to the use of the opening 26 and cavity 32 to form the device structure 50, the device structure 50 may be fabricated with a reduced number of masks in comparison with conventional fabrication processes for bipolar junction transistors and heterojunction bipolar transistors.

Figure 8:
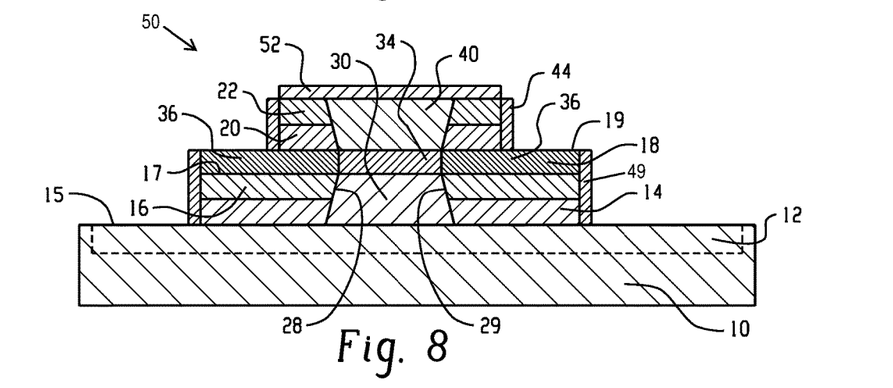
FIG. 8 is a cross-sectional view of a device structure in accordance with embodiments of the invention.

With reference to FIG. 8 in which like reference numerals refer to like features in FIG. 6 and in accordance with alternative embodiments, a protection layer 52 comprised of, for example, silicon nitride ($Si_3N_4$), is applied to cover the emitter 40 and the dielectric layer 22 surrounding the emitter 40. The contact area for the extrinsic base 36 is opened by patterning the protection layer 52 and the dielectric layers 20, 22, and the contact area for the collector 30 is opened by patterning the extrinsic base 36 and the dielectric layers 14, 16. The protection layer 52 may be removed after the contact area for the collector 30 is opened. Processing continues to form the dielectric spacers 49 and the protection layer 52 as described in the context of FIG. 7.

Figure 9:
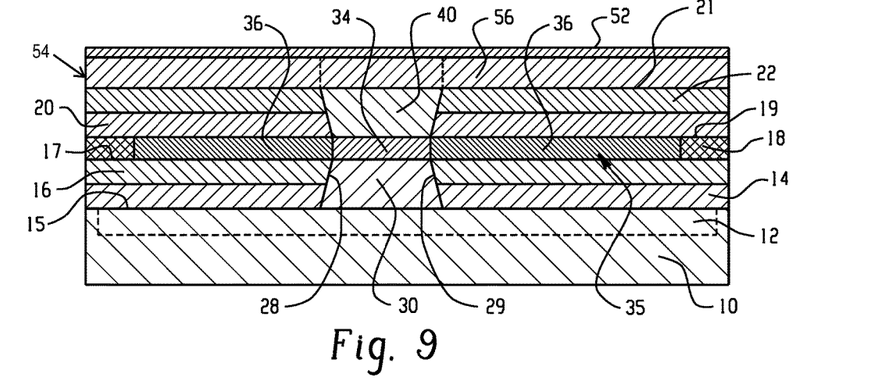
FIG. 9 is a cross-sectional view of a device structure in accordance with embodiments of the invention.

With reference to FIG. 9 in which like reference numerals refer to like features in FIG. 5 and in accordance with alternative embodiments, the field section 38 of the base layer 35 may be removed from the top surface 21 of the dielectric layer 22 and the sidewalls 28, 29 of the opening 26 above the intrinsic base 34. After the field section 38 of the base layer is removed, a semiconductor layer 54 is formed that includes the emitter 40 on the surface of the intrinsic base 34 in the open space inside the opening 26 above the top surface of the intrinsic base 34 and between the sidewalls 28, 29 over the portion of the opening 26 that extends through the dielectric layers 20, 22, as well as a field section 56 of the semiconductor layer 54 on the top surface of the dielectric layer 20 and above the emitter 40. The semiconductor layer 54 may be formed using a non-selective epitaxial growth process in which the semiconductor material of the emitter 40 nucleates for epitaxial growth as single-crystal semiconductor material, such as single-crystal silicon on intrinsic base 34, and the semiconductor material of the field section 56 forms as polycrystalline semiconductor material. The semiconductor material comprising the emitter 40 may be doped to have an opposite conductivity type from the intrinsic base 34. The emitter 40 may be heavily doped in situ during growth with, for example, an n-type dopant (e.g., phosphorus (P) or arsenic (As)) effective to impart n-type conductivity. The protection layer 52 is applied on the field section 56.

The contact area for the extrinsic base 36 is opened by patterning the protection layer 52 and the dielectric layers 20, 22, and the contact area for the collector 30 is opened by patterning the extrinsic base 36 and the dielectric layers 14, 16. The protection layer 52 may be removed after the contact area for the collector 30 is opened. Processing continues to form the dielectric spacers 44, the dielectric spacers 49, and the protection layer 52 as described in the context of FIG. 7.

In an alternative embodiment, the semiconductor layer 54 may be formed with the field section 38 of base layer 35 retained on, instead of removed from, the top surface 21 of the dielectric layer 22 and the sidewalls 28, 29 of the opening 26 above the intrinsic base 34. The semiconductor layer 54 subsumes the field section 38 of base layer 35 during the growth of the semiconductor layer 54. The doping level of the emitter 40 is much higher than the doping level of the field section 38 of base layer 35 such that the entirety of the emitter 40 will have the proper conductivity type due to counter-doping of the field section 38.

Figure 10:
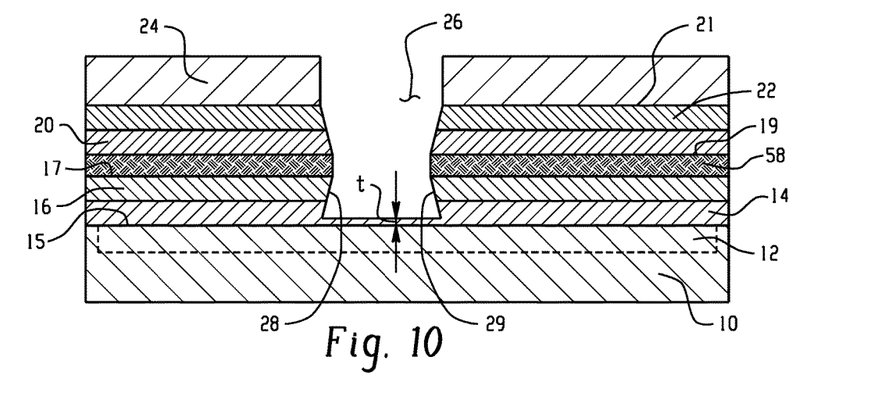
FIGS. 10-12 are cross-sectional views of a device structure at successive fabrication stages of a processing method in accordance with embodiments of the invention.

With reference to FIG. 10 in which like reference numerals refer to like features in FIGS. 1 and 2 and in accordance with alternative embodiments, the dielectric layer 18 may be replaced with a layer 58 composed of polycrystalline semiconductor material (e.g., polysilicon). Opening 26 is formed so as to extend in the vertical direction through the dielectric layers 20, 22, the polycrystalline semiconductor layer 58, and the dielectric layer 16, but only partially through the dielectric layer 14 so that a partial thickness, t, of the dielectric layer 14 remains on the top surface of the substrate 10. The profile of the opening 26 in layers 14 and 16 may be controlled using a wet chemical etch and/or chemical oxide removal (COR).

Figure 11:
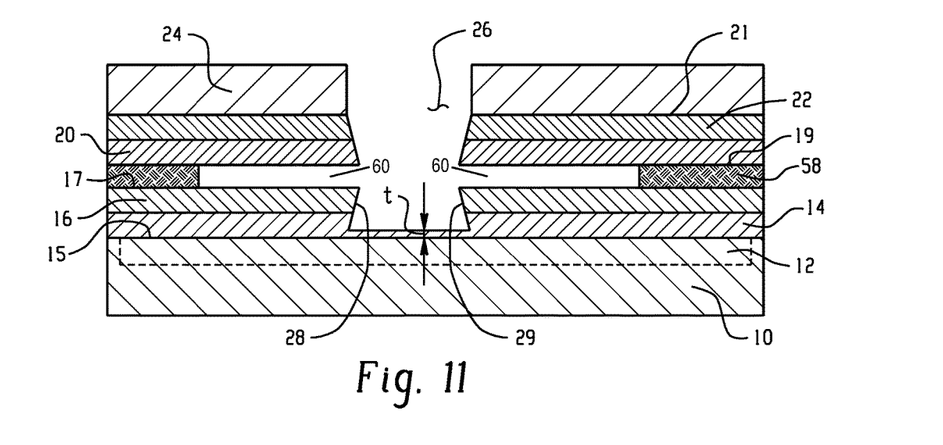

With reference to FIG. 11 in which like reference numerals refer to like features in FIG. 10 and at a subsequent fabrication stage, the polycrystalline semiconductor layer 58 may be recessed relative to the overlying dielectric layer 20 and the underlying dielectric layer 16 to define a cavity 60. A reactive ion etching (RIE) process may be used that removes the polycrystalline semiconductor of layer 58 selective to the dielectric materials of dielectric layers 20, 22 and dielectric layers 14, 16. The partial thickness of the dielectric layer 14 covering the substrate 10 inside the opening 26 protects the substrate 10 against etching when the polycrystalline semiconductor layer 58 is recessed.

Figure 12:
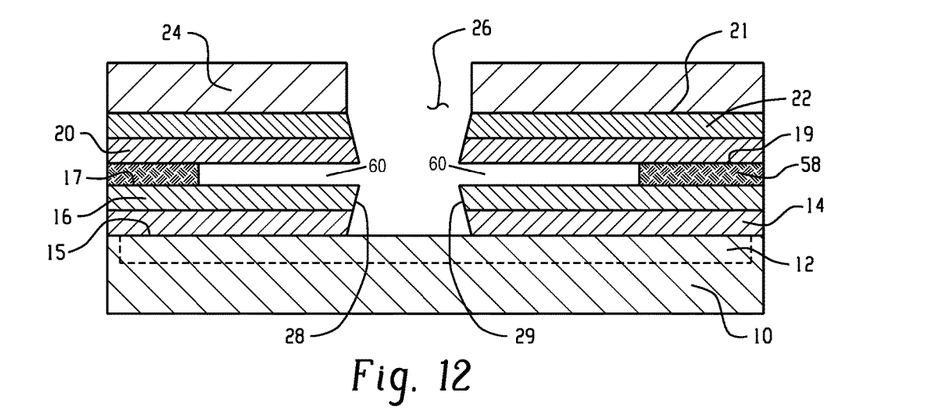

With reference to FIG. 12 in which like reference numerals refer to like features in FIG. 11 and at a subsequent fabrication stage, the partial thickness of the dielectric layer 14 covering the substrate 10 inside the opening 26 is removed to reveal the substrate 10. The collector 30 and the intrinsic base 34 are formed as single-crystal layers of semiconductor material inside of the trench as described in the context of FIGS. 4 and 5. During the growth of the intrinsic base 34, the missing sections of the polycrystalline semiconductor layer 58 located in the cavity 60 between the dielectric layer 16 and dielectric layer 20 are refilled with polycrystalline semiconductor material from the base layer 35. The base layer 35 may be comprised of a semiconductor material layer grown, for example, using a selective epitaxial growth (SEG) process such that the field section 38 (FIG. 5) is absent. The polycrystalline semiconductor material (e.g., SiGe) of the extrinsic base 36 may differ in composition from the polycrystalline semiconductor material (e.g., Si) of the polycrystalline semiconductor layer 58.

The process may continue as described in FIG. 5 to form an embodiment of the device structure 50.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a bipolar junction transistor, the method comprising:
    forming a layer stack including a first dielectric layer and a second dielectric layer on the first dielectric layer;
    etching an opening extending vertically through the layer stack;
    forming a collector inside the opening; and
    forming an intrinsic base inside the opening, wherein the intrinsic base has a vertical arrangement relative to the collector, the first dielectric layer has an etch rate that is greater than an etch rate of the second dielectric layer, the collector is located in a first portion of the opening extending through the first dielectric layer and the second dielectric layer, and the collector and the first portion of the opening have a tapered width that progressively decreases in a vertical direction with decreasing distance from the intrinsic base.

2. The method of claim 1 wherein the layer stack further includes an etch-selective layer on the second dielectric layer and a third dielectric layer on the etch-selective layer, and further comprising:
laterally recessing the etch-selective layer selective to the second dielectric layer and to the third dielectric layer so as to form a cavity extending vertically between the second dielectric layer and the third dielectric layer.

3. The method of claim 2 further comprising:
forming an extrinsic base inside the cavity,
wherein the extrinsic base and the cavity extend in a horizontal direction from the intrinsic base and the opening.

4. The method of claim 3 wherein forming the extrinsic base inside the cavity comprises:
epitaxially growing the intrinsic base on the collector inside the opening,
wherein the extrinsic base comprises a polycrystalline semiconductor material deposited inside the cavity when the intrinsic base is epitaxially grown.

5. The method of claim 3 wherein the etch-selective layer is polycrystalline semiconductor material, and etching the opening extending vertically through the layer stack comprises:
before the extrinsic base is formed, etching the opening through the second dielectric layer and partially through the first dielectric layer; and
after the extrinsic base is formed, etching the opening completely through the first dielectric layer.

6. The method of claim 1 wherein forming the intrinsic base inside the opening comprises:
epitaxially growing the intrinsic base on the collector inside the opening.

7. The method of claim 6 wherein the intrinsic base is epitaxially grown by a selective epitaxial growth process.

8. The method of claim 6 wherein a polycrystalline semiconductor material forms on sidewalls of the opening above the intrinsic base when the intrinsic base is epitaxially grown, and further comprising:
removing the polycrystalline semiconductor material from the sidewalls of the opening; and
after the polycrystalline semiconductor material is removed, forming an emitter positioned in the opening on the intrinsic base,
wherein the intrinsic base is positioned in the opening vertically between the collector and the emitter.

9. The method of claim 6 wherein a polycrystalline semiconductor material forms on sidewalls of the opening above the intrinsic base when the intrinsic base is epitaxially grown, and further comprising:
forming an emitter that is positioned inside the opening on the intrinsic base,
wherein the emitter is formed without removing the polycrystalline semiconductor material from the sidewalls of the opening, and the intrinsic base is positioned in the opening vertically between the collector and the emitter.

10. The method of claim 1 wherein the layer stack further includes a third dielectric layer on the second dielectric layer and a fourth dielectric layer on the third dielectric layer, and further comprising:
forming an emitter in a second portion of the opening extending vertically through the third dielectric layer and the fourth dielectric layer,
wherein the fourth dielectric layer has an etch rate that is greater than an etch rate of the third dielectric layer, and the emitter and the second portion of the opening have a tapered width that progressively decreases in the vertical direction with decreasing distance from the intrinsic base.

11. A method of fabricating a bipolar junction transistor, the method comprising:
forming a layer stack including a first dielectric layer and a second dielectric layer on the first dielectric layer;
etching an opening extending vertically through the layer stack;
forming a collector inside the opening;
epitaxially growing an intrinsic base on the collector inside the opening and a polycrystalline semiconductor material on sidewalls of the opening above the intrinsic base;
removing the polycrystalline semiconductor material from the sidewalls of the opening; and
after the polycrystalline semiconductor material is removed, forming an emitter positioned in the opening on the intrinsic base,
wherein the intrinsic base has a vertical arrangement relative to the collector, and the intrinsic base is positioned in the opening vertically between the collector and the emitter.

12. The method of claim 11 wherein the layer stack further includes an etch-selective layer on the second dielectric layer a third dielectric layer on the etch-selective layer, and further comprising:
laterally recessing the etch-selective layer selective to the second dielectric layer and to the third dielectric layer so as to form a cavity extending vertically between the second dielectric layer and the third dielectric layer.

13. The method of claim 12 further comprising:
forming an extrinsic base inside the cavity,
wherein the extrinsic base and the cavity extend in a horizontal direction from the intrinsic base and the opening.

14. The method of claim 13 wherein forming the extrinsic base inside the cavity comprises:
epitaxially growing the intrinsic base on the collector inside the opening,
wherein the extrinsic base comprises a polycrystalline semiconductor material deposited inside the cavity when the intrinsic base is epitaxially grown.

15. The method of claim 13 wherein the etch-selective layer is polycrystalline semiconductor material, and etching the opening extending vertically through the layer stack comprises:
before the extrinsic base is formed, etching the opening through the second dielectric layer and partially through the first dielectric layer; and
after the extrinsic base is formed, etching the opening completely through the first dielectric layer.

16. A method of fabricating a bipolar junction transistor, the method comprising:
forming a layer stack including a first dielectric layer and a second dielectric layer on the first dielectric layer;

etching an opening extending vertically through the layer stack;
forming a collector inside the opening;
epitaxially growing an intrinsic base on the collector inside the opening and a polycrystalline semiconductor material on sidewalls of the opening above the intrinsic base; and
forming an emitter positioned in the opening on the intrinsic base,
wherein the intrinsic base has a vertical arrangement relative to the collector, the emitter is formed without removing the polycrystalline semiconductor material from the sidewalls of the opening, and the intrinsic base is positioned in the opening vertically between the collector and the emitter.

17. The method of claim 16 wherein the layer stack further includes an etch-selective layer on the second dielectric layer, a third dielectric layer on the etch-selective layer, and further comprising:
laterally recessing the etch-selective layer selective to the second dielectric layer and to the third dielectric layer so as to form a cavity extending vertically between the second dielectric layer and the third dielectric layer.

18. The method of claim 17 further comprising:
forming an extrinsic base inside the cavity,
wherein the extrinsic base and the cavity extend in a horizontal direction from the intrinsic base and the opening.

19. The method of claim 18 wherein forming the extrinsic base inside the cavity comprises:
epitaxially growing the intrinsic base on the collector inside the opening,
wherein the extrinsic base comprises a polycrystalline semiconductor material deposited inside the cavity when the intrinsic base is epitaxially grown.

20. The method of claim 18 wherein the etch-selective layer is polycrystalline semiconductor material, and etching the opening extending vertically through the layer stack comprises:
before the extrinsic base is formed, etching the opening through the second dielectric layer and partially through the first dielectric layer; and
after the extrinsic base is formed, etching the opening completely through the first dielectric layer.

* * * * *